United States Patent [19]
Lee

[11] Patent Number: 5,537,426
[45] Date of Patent: Jul. 16, 1996

[54] OPERATION APPARATUS FOR DERIVING ERASURE POSITION Γ(X) AND FORNEY SYNDROME T(X) POLYNOMIALS OF A GALOIS FIELD EMPLOYING A SINGLE MULTIPLIER

[75] Inventor: Dong H. Lee, Seoul, Rep. of Korea

[73] Assignee: Goldstar Co., Ltd., Rep. of Korea

[21] Appl. No.: 68,434

[22] Filed: May 27, 1993

[30] Foreign Application Priority Data

May 29, 1992 [KR] Rep. of Korea ............. 9319/1992
Jun. 25, 1992 [KR] Rep. of Korea ............. 11110/1992

[51] Int. Cl.⁶ .............................................. G06F 11/10
[52] U.S. Cl. ................................. 371/37.1; 371/38.1
[58] Field of Search ................... 371/37.1, 38.1, 371/39.1, 40.1

[56] References Cited

U.S. PATENT DOCUMENTS

| | | |
|---|---|---|
| 4,527,269 | 7/1985 | Wood et al. ............... 371/37 |
| 4,597,083 | 6/1986 | Stenerson ................. 371/37 |
| 4,868,828 | 9/1989 | Shao et al. ............... 371/37.5 |
| 4,873,688 | 10/1989 | Maki et al. |
| 5,099,482 | 3/1992 | Cameron .................. 371/37.1 |
| 5,170,399 | 12/1992 | Cameron et al. .......... 371/37.1 |

*Primary Examiner*—Roy N. Envall, Jr.
*Assistant Examiner*—Thomas E. Brown
*Attorney, Agent, or Firm*—Fliesler, Dubb, Meyer & Lovejoy

[57] ABSTRACT

Operation apparatus for deriving an error position polynomial Γ(x) and a Forney syndrome polynomial T(x) of a Galois field capable of reducing the required number of Galois field multipliers to one, irrespective of the maximum error correction capacity in a Galois field operation, thereby reducing the chip area and achieving a correct operation. The operation apparatus comprises a storing register for storing result values sequentially inputted therein, a multiplexor for receiving outputs from the storing register and selecting a necessary coefficient therefrom, a first register and a second register for storing a coefficient currently selected by the multiplexor and a coefficient previously selected by the multiplexor, respectively, a multiplier for multiplying a value corresponding to an input erasure position and the coefficient stored in the second register, and an adder for adding a value outputted from the multiplier to the coefficient stored in the first register and inputting the resultant value to the storing register.

6 Claims, 8 Drawing Sheets

FIG. 3
PRIOR ART

| ... $R_3$ | $R_2$ | $R_1$ | $R_0$ |
|---|---|---|---|
| ... 0 | 0 | 0 | 1 |
| ... 0 | 0 | 1 | $\alpha^{j1}$ |
| ... 0 | 1 | $\alpha^{j1}+\alpha^{j2}$ | $\alpha^{j1}+\alpha^{j2}$ |
| ... 1 | $\alpha^{j1} + \alpha^{j2} + \alpha^{j3}$ | $(\alpha^{j2} + \alpha^{j1}) \cdot \alpha^{j3} + \alpha^{j1} \cdot \alpha^{j2}$ | $\alpha^{j1} \cdot \alpha^{j2} \cdot \alpha^{j3}$ |
| ... | ... | ... | ... |

FIG. 9

| n | $\Gamma_i$ | $\Gamma_{i-1}$ | $\Gamma(X)$ REGISTER INPUT |
|---|---|---|---|
| 1 | 1 | 0 | 1 |
|   | 0 | 1 | $\alpha^{j1}$ |
| 2 | 1 | 0 | 1 |
|   | $\alpha^{j1}$ | 1 | $\alpha^{j1} + \alpha^{j2}$ |
|   | 0 | $\alpha^{j1}$ | $\alpha^{j1} \cdot \alpha^{j2}$ |
| 3 | 1 | 0 | 1 |
|   | $\alpha^{j1} + \alpha^{j2}$ | 1 | $\alpha^{j1} + \alpha^{j2} + \alpha^{j3}$ |
|   | $\alpha^{j1} \cdot \alpha^{j2}$ | $\alpha^{j1} + \alpha^{j2}$ | $\alpha^{j3} \cdot \alpha^{j1} + \alpha^{j1} \cdot \alpha^{j2} + \alpha^{j2} \cdot \alpha^{j3}$ |
|   | 0 | $\alpha^{j1} \cdot \alpha^{j2}$ | $\alpha^{j1} \cdot \alpha^{j2} \cdot \alpha^{j3}$ |
| ⋮ | ⋮ | ⋮ | ⋮ |

FIG. 10

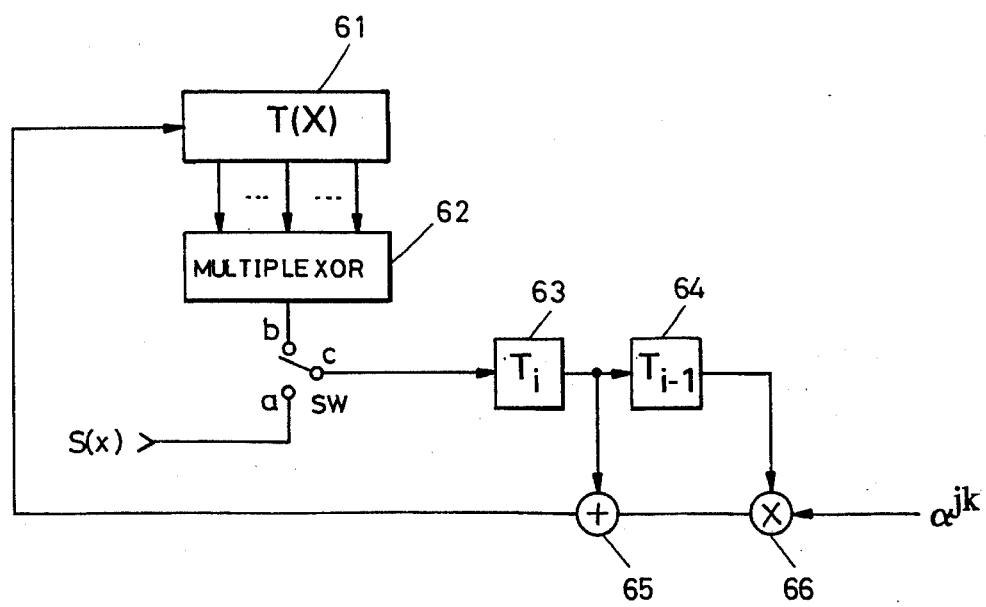

OPERATION APPARATUS FOR DERIVING ERASURE POSITION Γ(X) AND FORNEY SYNDROME T(X) POLYNOMIALS OF A GALOIS FIELD EMPLOYING A SINGLE MULTIPLIER

BACKGROUND OF THE INVENTION

1. Field of the Invention

The present invention relates to error correction, and more particularly to an operation apparatus with multipliers for deriving an error position polynomial Γ(x) and a Forney syndrome polynomial Γ(x) of a Galois field.

2. Description of the Prior Art,

Generally, an erasure is known in terms of position, even though unknown in terms of size, as compared with an error whose position and size are unknown. Accordingly, when information indicative of an erasure of some symbol is applied to a decoder, he erasure corresponding to two times the same number of parity errors can be corrected.

Referring to FIG. 1, here is illustrated a general erasure position power operation apparatus. The operation apparatus comprises an AND gate 1 having one input for receiving information about erasure, namely, erasure positions of binary values. To the other input of the AND gate 1, register 2 and a multiplier 3 are connected. In the AND gate 1, the erasure position is AND-combined with a value obtained through the register 2 and the multiplier 4. To an output of the AND gate 1, a non-zero detector 4 is connected, which receives an output signal from the AND gate 1 and generates a control signal $C_1$. The control signal $C_1$ is applied to a 2t symbol latch 5 via a switch $SW_a$. According to the control signal $C_1$, the 2t symbol latch 5 outputs powers for the erasure positions, namely, values $\alpha^{j1}, \alpha^{j2}, \ldots$ corresponding to respective erasure positions. Here, the value $\alpha^{j1}$ represents the value corresponding to the first erasure position and the value $\alpha^{j2}$ represents the value corresponding to the second erasure position.

Since the erasure positions are already known, they can be expressed by the following polynomial:

$$\Gamma(X) = \prod_{i=1}^{e} (1 - \alpha^{j(i)} \cdot x)$$

wherein, e represents the number of erasures.

FIG. 2 is a block diagram of a conventional operation apparatus utilizing the polynomial for erasure positions.

As shown in FIG. 2, the operation apparatus comprises a non-zero detector 10 for receiving an erasure position value $\alpha^{j(i)}$ and detecting whether the received erasure position value is zero or not, and a multi-stage operation unit including a plurality of operation circuits $20_0$ to $20_{2t-1}$. The operation unit comprises a plurality of adders $A_0$ to $A_{2t-1}$ and a plurality of registers $R_0$ to $R_{2t-1}$ connected with the adders $A_0$ to $A_{2t-1}$ via a plurality of switches $SW_0$ to $SW_{2t-1}$, respectively. Each of the switches $SW_0$ to $SW_{2t-1}$ are controlled by an output signal from the non-zero detector 10, to be switched on or off. According to the switching operations of the switches $SW_0$ to $SW_{2t-1}$, the registers $R_0$ to $R_{2t-1}$ store temporally output values from the adders $A_0$ to $A_{2t-1}$, respectively. The operation unit also comprises a plurality of multipliers $M_0$ to $M_{2t-1}$ each for multiplying each value stored in each corresponding one of the registers $R_0$ to $R_{2t-1}$ and each corresponding erasure position value $\alpha^{j(i)}$ and sending the resultant value to each corresponding one of the adders $A_0$ to $A_{2t-1}$.

In the operation apparatus with the above-mentioned construction, the register $R_0$ is initially loaded with the value of 1, while the remaining registers $R_1$ to $R_{2t-1}$ are initially loaded with the value of 0.

When a value $\alpha^{j(1)}$ corresponding to the first erasure position is received in the operation apparatus, it is applied to the non-zero detector 10 and respective multipliers $M_0$ to $M_{2t-1}$ of the operation circuits $20_0$ to $20_{2t-1}$.

The non-zero detector 10 detects whether the received erasure position value is zero or not and outputs a detect signal, so as to control respective switches $SW_0$ to $SW_{2t-1}$ of the operation circuits $20_0$ to $20_{2t-1}$. The control of each switch is carried out such that the switch is switched to its closed state when the input value of non-zero detector 10 is not zero and to its opened state when the input value is zero.

This procedure will be described in detail.

Where the first register $R_0$ has an initial value of 1 while the remaining registers $R_1$ to $R_{2t-1}$ have initial values of 0 at a state that the input value of non-zero detector 10 is not zero; the register $R_0$ is loaded with the first erasure position value $\alpha^{j(1)}$, whereas the register $R_1$ is loaded with the value of 1. In this case, the remaining registers $R_2$ to $R_{2t-1}$ are still maintained as being loaded with the value of 0.

As the above procedure is repeated, the register $R_0$ is sequentially loaded with values in the order of $0 \rightarrow 1 \rightarrow \alpha^{j1} \rightarrow \alpha^{j1} \cdot \alpha^{j2} \rightarrow \alpha^{j1} \cdot \alpha^{j2} \cdot \alpha^{j3} \rightarrow \alpha j1 \cdot \alpha^{j2} \alpha^{j3}$ ... The register $R_1$ is sequentially loaded with values in the order of $0 \rightarrow 1 \rightarrow \alpha^{j1} \rightarrow \alpha^1 + \alpha^{j2} \rightarrow (\alpha^{j1} + \alpha^{j2})\alpha^{j3} \rightarrow \alpha j1 \cdot \alpha^{j2}$ ... On the other hand, the register $R_2$ is sequentially loaded with values in the order of $0 \rightarrow 0 \rightarrow 1 \rightarrow \alpha^{j1} + \alpha^{j2} + \alpha^{j3}$ ....

The sequential value storing procedures executed in the registers are shown in FIG. 3.

FIG. 5 is a block diagram of a conventional operation apparatus for deriving a Forney syndrome.

As shown in FIG. 5, the operation apparatus comprises a non-zero detector 10a for receiving an erasure position value $\alpha^{j(i)}$ and detecting whether the received erasure position value is zero or not, and a multi-stage operation unit including a plurality of operation circuits $20a_0$ to $20a_{2t-1}$. The operation unit comprises a plurality of adders $A_0$ to $A_{2t-1}$ and a plurality of registers $S_0$ to $S_{2t-1}$ connected with the adders $A_0$ to $A_{2t-1}$ via a plurality of first switches $SW_b$, respectively. Each of the first switches $SW_b$ are controlled by an output signal from the non-zero detector 10a, to be switched on or off. According to the switching operations of the first switches $SW_b$, the registers $S_0$ to $S_{2t-1}$ store temporally output values from the adders $A_0$ to $A_{2t-1}$, respectively. The operation unit also comprises a plurality of multipliers $M_0$ to $M_{2t-1}$ each for multiplying each value loaded in each corresponding one of the registers $S_0$ to $S_{2t-1}$ and each corresponding erasure position value $\alpha^{j(i)}$ and sending the resultant value to each corresponding one of the adders $A_0$ to $A_{2t-1}$. The operation apparatus also comprises an output unit 30 including a plurality of registers $T_0$ to $T_{2t-1}$ each connected to each corresponding one of the registers $S_0$ to $S_{2t-1}$ via a second switch $SW_c$.

In the operation apparatus with the above-mentioned construction, the registers $S_0$ to $S_{2t-1}$ of the operation circuits $20a_0$ to $20a_{2t-1}$ are initially loaded with the values of $S_0, S_1, \ldots,$ and $S_{2t-1}$ which are coefficients of the polynomial of the syndrome, respectively.

In similar manner to the case of FIG. 2, this operation apparatus receives sequentially values $\alpha^{k(i)}$ corresponding to erasure positions and controls the switches $SW_b$ via the non-zero detector 10a so that the values $\alpha^{j(i)}$ are applied to the multipliers $M_0$ to $M_{2t-1}$, respectively.

At the first clock, thereafter, the register $S_0$ is loaded with the value of $S_0$, whereas the register $S_1$ is loaded with the value of $S_1 + S_0 \cdot \alpha^{j(i)}$. On the other hand, the register $S_2$ is loaded with the value of $S_2 + S_1 \cdot \alpha^{k(1)}$. In such a manner, the register $S_j$ is loaded with the value of $S_j + S_j \cdot \alpha^{j(i)}$.

As the above procedure is repeated according to inputting of erasure position values $\alpha^{j(i)}$, the registers $S_0$ to $S_{2t-1}$ are loaded with coefficients of the polynomial.

At this time, the second switches $SW_c$ are switched to its closed state by the control signal $C_2$, so that the coefficients loaded in the registers $S_0$ to $S_{2t-1}$ are transferred to the registers $T_0$ to $T_{2t-1}$ of the output unit 30, respectively.

FIG. 4 is a circuit diagram of Galois field (GF) multipliers $M_0$ to $M_{2t-1}$ used in both the operation apparatus of FIG. 3 and the operation apparatus of FIG. 5. Each adder is an $GF(2^4)$ adder for operating one byte comprised of four bits. The $GF(2^4)$ adder comprises an AND gate and an exclusive OR gate.

First, a source polynomial $P(X)$ having the degree of 4 is needed for expanding $GF(2)$ up to $GF(2^4)$.

That is, assuming the source polynomial $P(X)=X^4+X+1$, elements of all fields are expressed by a cubic-nomials $a_3X^3+a_2X^2+a_1X+a_0=a(X)$. In this case, $a_i$ represents elements of $GF(2)$.

When the cubic-nomial is expressed for $\tau$ and $\beta$ indicative of input values of each AND gate, and $\Theta$ indicative of one input value of each exclusive OR gate, the following cubic-nomials are obtained:

$\tau(X)=\tau_3X^3+\tau_2X^2+\tau_1X+\tau_0$ $\beta(X)=\beta_3X^3+\beta_2X^2+\beta_1X+\beta_0$ $\Theta(X)=\Theta_3X^3+\Theta_2X^2+\Theta_1X+\Theta_0$ Also, $\tau \cdot \beta$ indicative of the output value of each AND gate is expressed by the following equation:

$$\tau \cdot \beta = \tau(X) \, \beta(X) \bmod P(X)$$

Assuming $\tau \cdot \beta = K_3X^3+K_2X^2+K_1X+K_0$ the output value $\tau \cdot \beta + \Theta$ of each exclusive OR gate is expressed by the following cubic-nomial:

$$\tau \cdot \beta = (K_3+\Theta_3)X^3+(K_2+\Theta_2)X^2+(K_1+\Theta_1)X+(K_0+\Theta_0)=W_3X^3+W_2X^2+W_1X+W_0$$

The operation of the first row is carried out as follows:

$\tau^{(1)}(X)=\tau(X)$ $\Theta^{(1)}(X)=\Theta(X)+\beta_0\tau(X)$

The operation of the i-th row is carried out as follows:

$\tau^{(i+1)}(X)=X\tau^{(i)}(X) \bmod P(X)$ $\Theta^{(i+1)}(X)=\Theta^{(i)}(X)+\beta_i\tau^{(i+1)}(X)$ Each cell performs the following two functions:

$$\tau_j^{(i+1)}=\tau_j^{(i)}+\tau_3^{(i)}P_j$$

$$\Theta_j^{(i+1)}=\Theta_{j-1}^{(i)}+\beta_i\tau_j^{(i+1)}$$

wherein, $\Theta_j^{(i+1)}$ represents the i-th row ·j-th column.

For example, in the first cell of the second row, $\tau_3$ and $\beta_1$ are ANDed in the AND gate $AD_{2,1}$ and then exclusively ORed in the exclusive OR gate $XOR_{2,1}$, so as to be outputted as $\Theta_0^{(2)}$. In the second cell, $\tau_3^{(0)}$ and $\tau_0$ are exclusively ORed in the exclusive OR gate $XOR_{2,2}$, so as to be provided as one input of AND gate $AD_{2,3}$.

The output from the exclusive OR gate $XOR_{2,2}$ is ANDed with $\beta_1$ in the AND gate $AD_{2,3}$ and then exclusively ORed in the exclusive OR gate $XOR_{2,3}$, so as to be outputted as $\Theta_1^{(1)}$. In such a manner, the operation is repeated up to the final row.

As a result, the following results are obtained:

$\Theta_0^{(4)}=W_0^{(4)}=W_1$, $\Theta_2^{(4)}=\Theta_2$, $\Theta_3^{(4)}=W_3$.

In the conventional circuit, however, the content of registers based on the polynomial for erasure positions includes the initial value of 1 only for the register $R_0$ and the initial value of 0 for the remaining registers $R_1$ to $R_{2t-1}$.

For each input $\alpha^{j(i)}$ only one of such registers is used while the remaining registers are unnecessary. Accordingly, the multipliers for deriving values for the remaining registers are also unnecessary.

That is, for the operation of the polynomial for erasure positions, 2t GF multipliers and 2t adders are needed. In GF multipliers, the larger the symbol field, the more the number of exclusive OR gates.

As a result, where a Reed Solomon decoder is realized by using very large size integrated circuit chips, the area occupied by the multipliers is increased due to the increased number of exclusive OR gates. Furthermore, when symbol fields of codes are very large and the erasure correction capacity is large, the chip area becomes relatively large. The flow of signals is also vague, so that a correct operation can not be carried out.

SUMMARY OF THE INVENTION

Therefore, an object of the invention is to provide an operation apparatus capable of reducing the number of Galois field multipliers to one, irrespective of the maximum error correction capacity in a Galois field operation, thereby reducing the chip area and achieving a correct operation, In accordance with the present invention, this object can be accomplished by providing an operation apparatus comprising: a storing register for storing result values sequentially inputted therein; a multiplexor for receiving outputs from the storing register and selecting a necessary coefficient therefrom; a first register and a second register for storing a coefficient currently selected by the multiplexor and a coefficient previously selected by the multiplexor, respectively; a multiplier for multiplying a value corresponding to an input erasure position and the coefficient loaded in the second register; and an adder for adding a value outputted from the multiplier to the coefficient loaded in the first register and inputting the resultant value to the storing register.

The adder logically operates multiplication outputs ($W_0$, $W_1$, $W_2$ and $W_3$) for 4-bit input data ($\tau_0$, $\tau_1$, $\tau_2$ and $\tau_3$) and 4-bit input data ($\beta_0$, $\beta_1$, $\beta_2$ and $\beta_3$), in the following order:

$W_0=(\tau_0 \cdot \beta_0)+(\tau_1 \cdot \beta_3)+(\tau_3 \cdot \beta_1)+(\tau_2 \cdot \beta_2)$ $W_1=(\tau_1 \cdot \beta_0)+(\tau_3 \cdot \beta_1)+(\tau_0 \cdot \beta_1)+((\tau_3 \cdot \beta_2)+(\tau_2 \cdot \beta_2))+(\tau_1 \cdot \beta_3)$ $W_2=(\tau_2 \cdot \beta_0)+(\tau_2 \cdot \beta_1)+((\tau_3 \beta_2)+(\tau_0 \cdot \beta_2))+((\tau_2 \cdot \beta_3)+(\tau_3 \cdot \beta_3))$ $W_3=(\tau_3 \cdot \beta_0)+(\tau_2 \cdot \beta_1)+(\tau_1 \cdot \beta_2)+((\tau_0 \cdot \beta_3)+(\tau_3 \cdot \beta_3))$.

Upon receiving a power corresponding to one erasure position, the operation apparatus derives coefficients of a polynomial for the erasure position while increasing the degree of the erasure position polynomial one by one. The derived coefficients are loaded. Accordingly, it is possible to derive the erasure position polynomial by using one multiplier and one adder, irrespective of the error correction capacity. As a result, the chip area can be greatly reduced.

BRIEF DESCRIPTION OF THE DRAWINGS

Other objects and aspects of the invention will become apparent from the following description of embodiments with reference to the accompanying drawings in which:

FIG. 3 is a table illustrating variations in register values in the operation apparatus of FIG. 2;

FIG. 9 is a table illustrating variations in register values in the operation apparatus of FIG. 6; and FIG. 10 is a block diagram of a Fourney syndrome operation apparatus according to a second embodiment of the present invention.

DETAILED DESCRIPTION OF THE PREFERRED EMBODIMENTS

Figure 6:
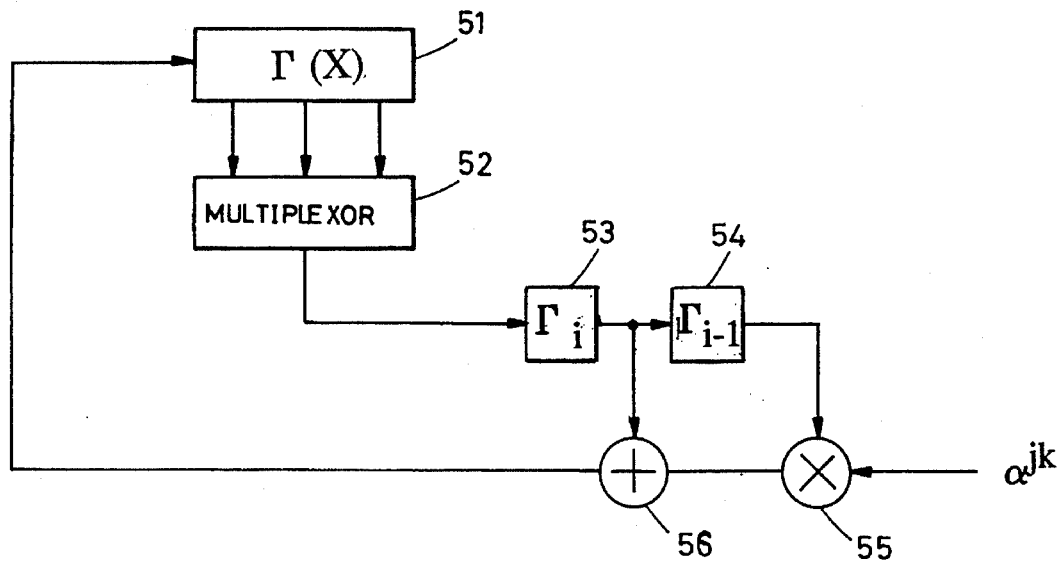
FIG. 6 is a block diagram of an apparatus for operating a polynomial for erasure positions in accordance with a first embodiment of the present invention.

Referring to FIG. 6, there is illustrated an apparatus for operating a polynomial for erasure positions in accordance with a first embodiment of the present invention.

As shown in FIG. 6, the operation apparatus comprises a storing register 51 for storing results sequentially inputted therein and a multiplexor 52 for receiving outputs from the storing register 51 and selecting a necessary coefficient. To the multiplexor 52, a first register 53 and a second register 54 are connected, which receive the coefficient currently selected by the multiplexor 52 and the coefficient just previously selected by the multiplexor 52, respectively. The operation apparatus also comprises a multiplier 55 for multiplying a value corresponding to an input erasure position and the coefficient loaded in the second register 54, and an adder 56 for adding a value outputted from the multiplier 55 to the coefficient loaded in the first register 53.

Figure 7:
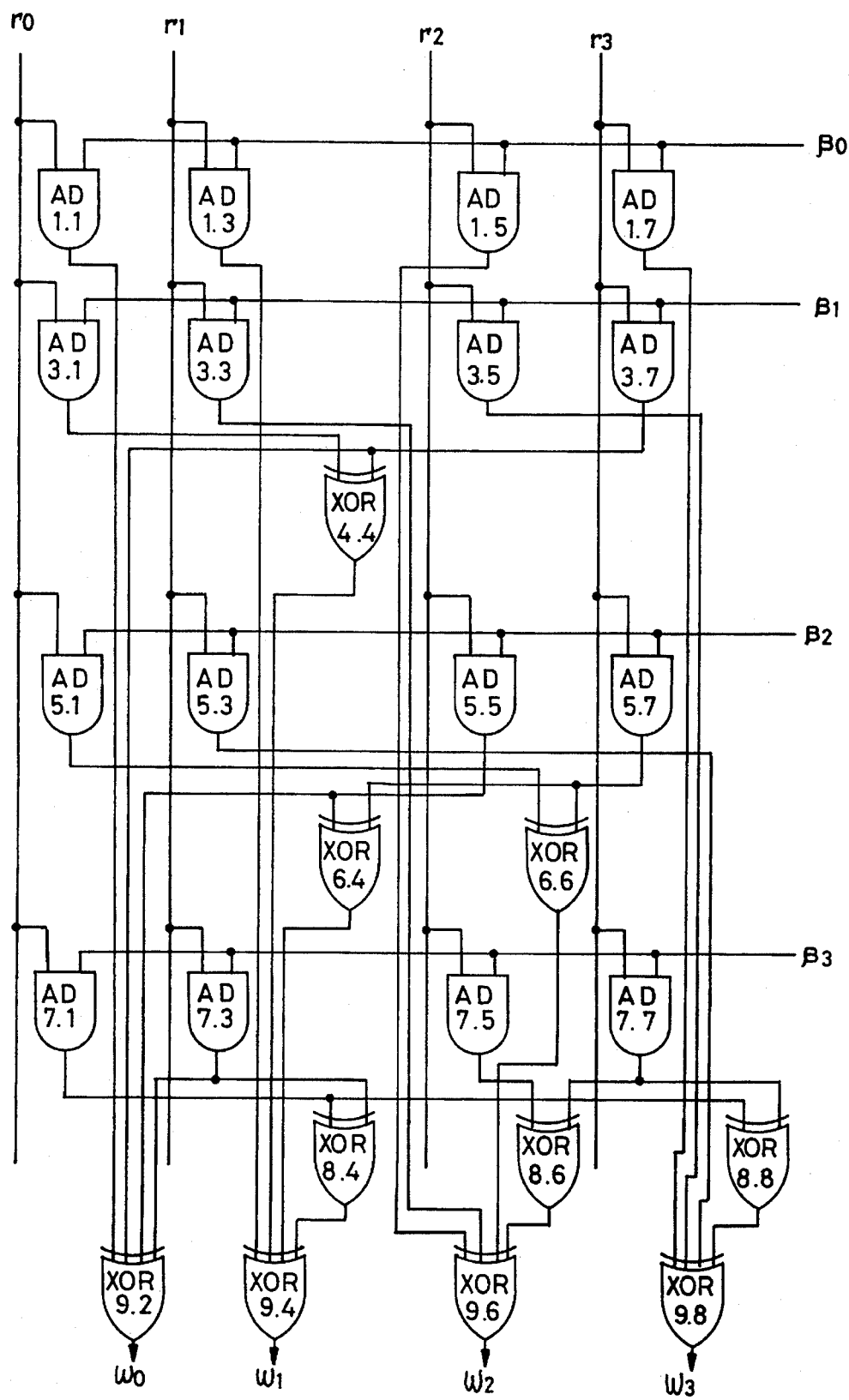
FIG. 7 is a circuit diagram of a multiplier in the operation apparatus of FIG. 6.

FIG. 7 is a circuit diagram of the multiplier of FIG. 6. As shown in FIG. 6, the multiplier comprises a plurality of AND gates $AD_{1.1}$, $AD_{1.3}$, $AD_{1.5}$, $AD_{1.7}$, $AD_{3.1}$, $AD_{3.3}$, $AD_{3.5}$, $AD_{3.7}$, $AD_{5.1}$, $AD_{5.3}$, $AD_{5.5}$, $AD_{5.7}$, $AD_{7.1}$, $AD_{7.3}$, $AD_{7.5}$ and $AD_{7.7}$ each for AND-combining a selected one of 4-bit input data $\tau_0$, $\tau_1$, $\tau_2$ and $\tau_3$ and a selected one of 4-bit input data $\beta_0$, $\beta_1$, $\beta_2$ and $\beta_3$. A plurality of exclusive OR gates $XOR_{4.4}$, $XOR_{6.4}$, $XOR_{6.6}$, $XOR_{8.4}$, $XOR_{8.6}$ and $XOR_{8.8}$ are also provided for exclusively ORing outputs from the AND gates $AD_{3.1}$ and $AD_{3.7}$, outputs from the AND gates $AD_{5.5}$ and $AD_{5.7}$, outputs from the AND gates $AD_{5.1}$ and $AD_{5.7}$, outputs from the AND gates $AD_{7.1}$ and $AD_{7.3}$, outputs from the AND gates $AD_{7.5}$ and $AD_{7.7}$, and outputs from the AND gates $AD_{7.1}$ and $AD_{7.7}$, respectively. The multiplier also comprises an exclusive OR gate $XOR_{9.2}$ for exclusively ORing outputs from the AND gates $AD_{1.1}$, $AD_{3.7}$, $AD_{5.5}$ and $AD_{7.3}$, an exclusive OR gate $XOR_{9.4}$ for exclusively ORing an output from the AND gate $AD_{1.3}$ and outputs from the exclusive OR gates $XOR_{4.4}$, $XOR_{6.4}$ and $XOR_{8.4}$, an exclusive OR gate $XOR_{9.6}$ for exclusively ORing outputs from the AND gates $AD_{1.5}$ and $AD_{3.3}$ and outputs from the exclusive OR gates $XOR_{6.6}$ and $XOR_{8.6}$, and an exclusive OR gate $XOR_{9.8}$ for exclusively ORing outputs from the AND gates $AD_{1.7}$, $AD_{3.5}$ and $AD_{5.3}$ and an output from the exclusive OR gate $XOR_{8.8}$.

In the AND gates $AD_{i,j}$ and the exclusive OR gates $XOR_{i,j}$, i and j represent row and column, respectively. Data outputted from the exclusive OR gates $XOR_{9.2}$, $XOR_{9.4}$, $XOR_{9.6}$ and $XOR_{9.8}$ are values $W_0$, $W_1$, $W_2$ and $W_3$ obtained by multiplying input data $\tau_0$, $\tau_1$, $\tau_2$ and $\tau_3$ and input data $\beta_0$, $\beta_1$, $\beta_2$ and $\beta_3$, respectively.

In operating the erasure position polynomial, since the erasure is known in terms of position, even though unknown in terms of size, the erasure position polynomial can be derived by using the following equation:

$$\Gamma(X) = \prod_{i=1}^{e} (1 - \alpha^{j(i)} \cdot x)$$

wherein, e represents the number of erasures.

Figure 1:
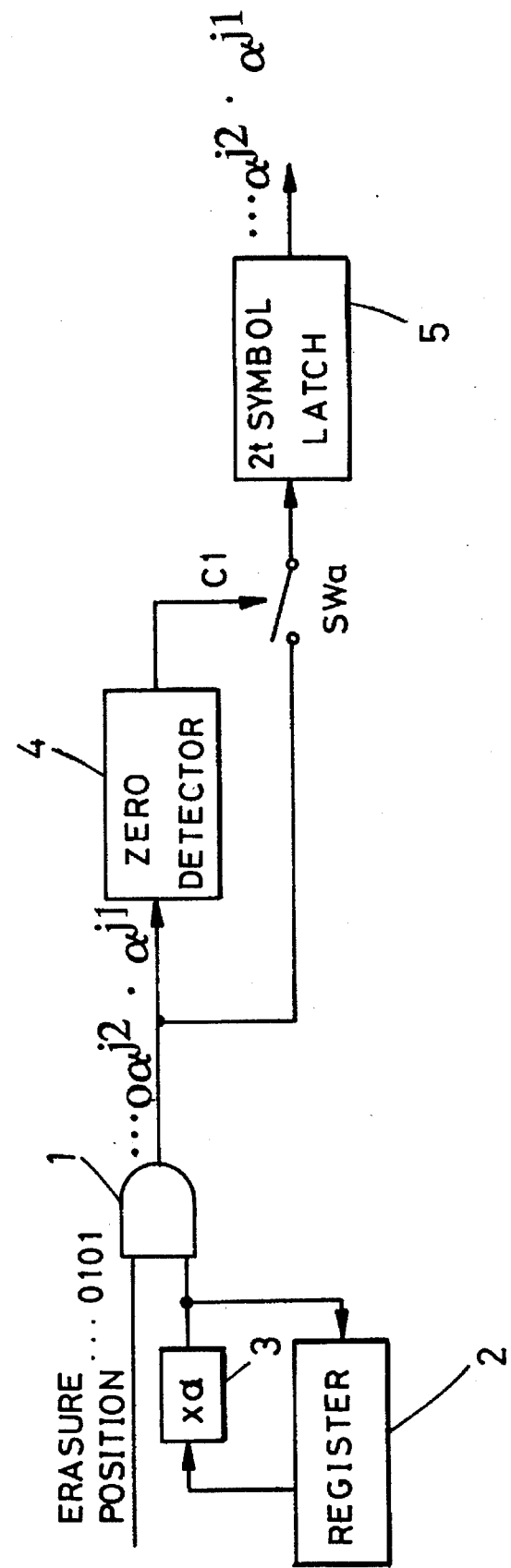
FIG. 1 is a block diagram of a general erasure position power operation apparatus.
Figure 2:
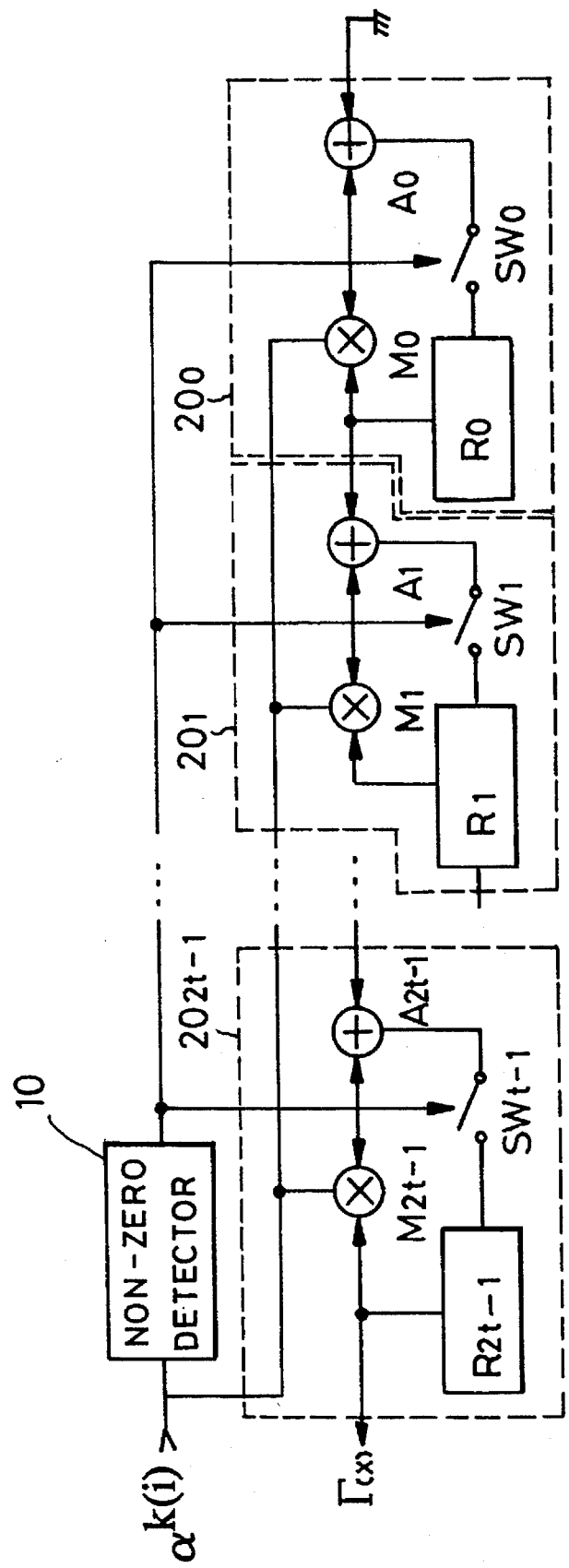
FIG. 2 is a block diagram of a conventional operation apparatus utilizing a polynomial for erasure positions.
Figure 4:
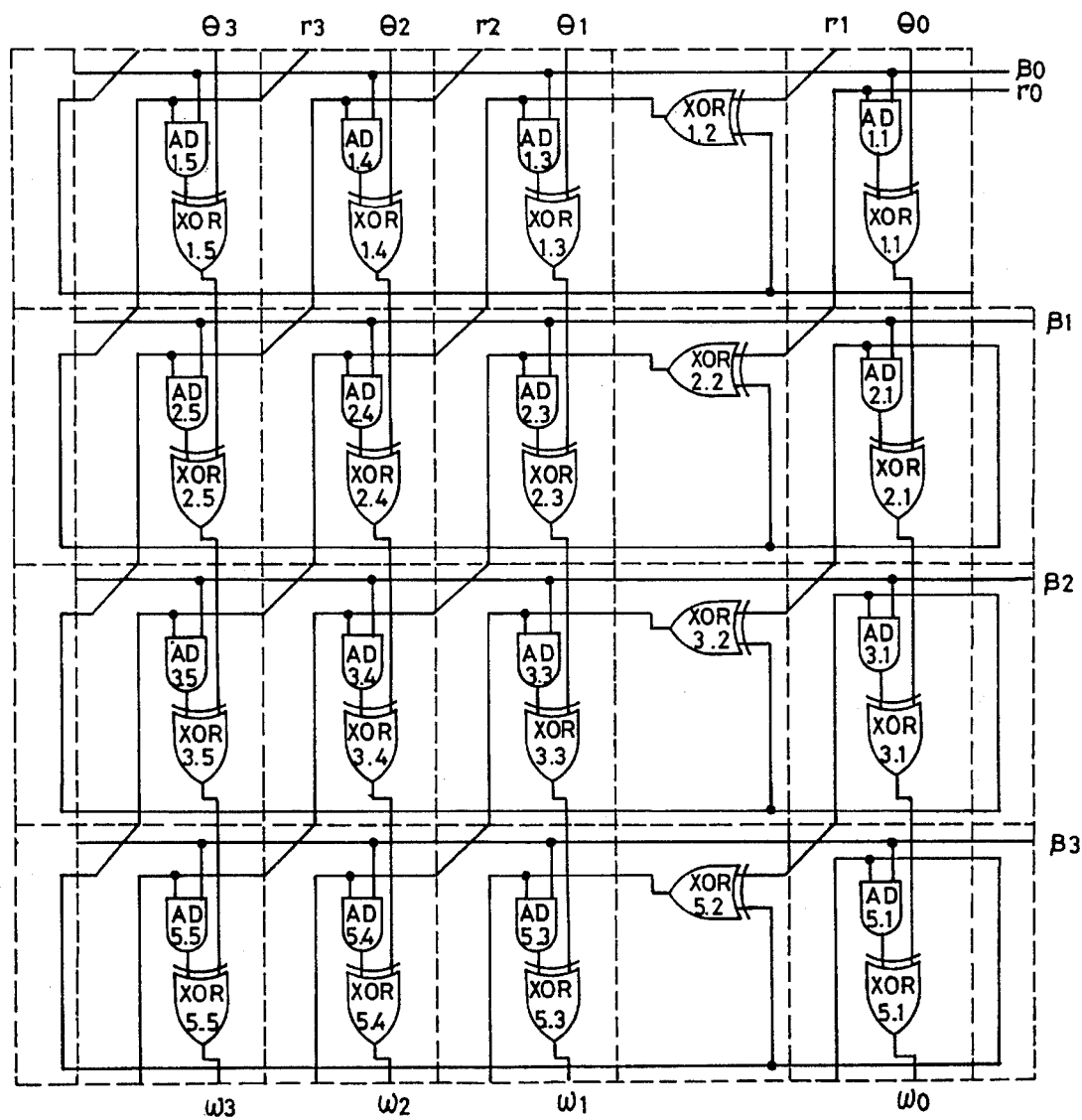
FIG. 4 is a circuit diagram of the multiplier of FIG. 2.
Figure 5:
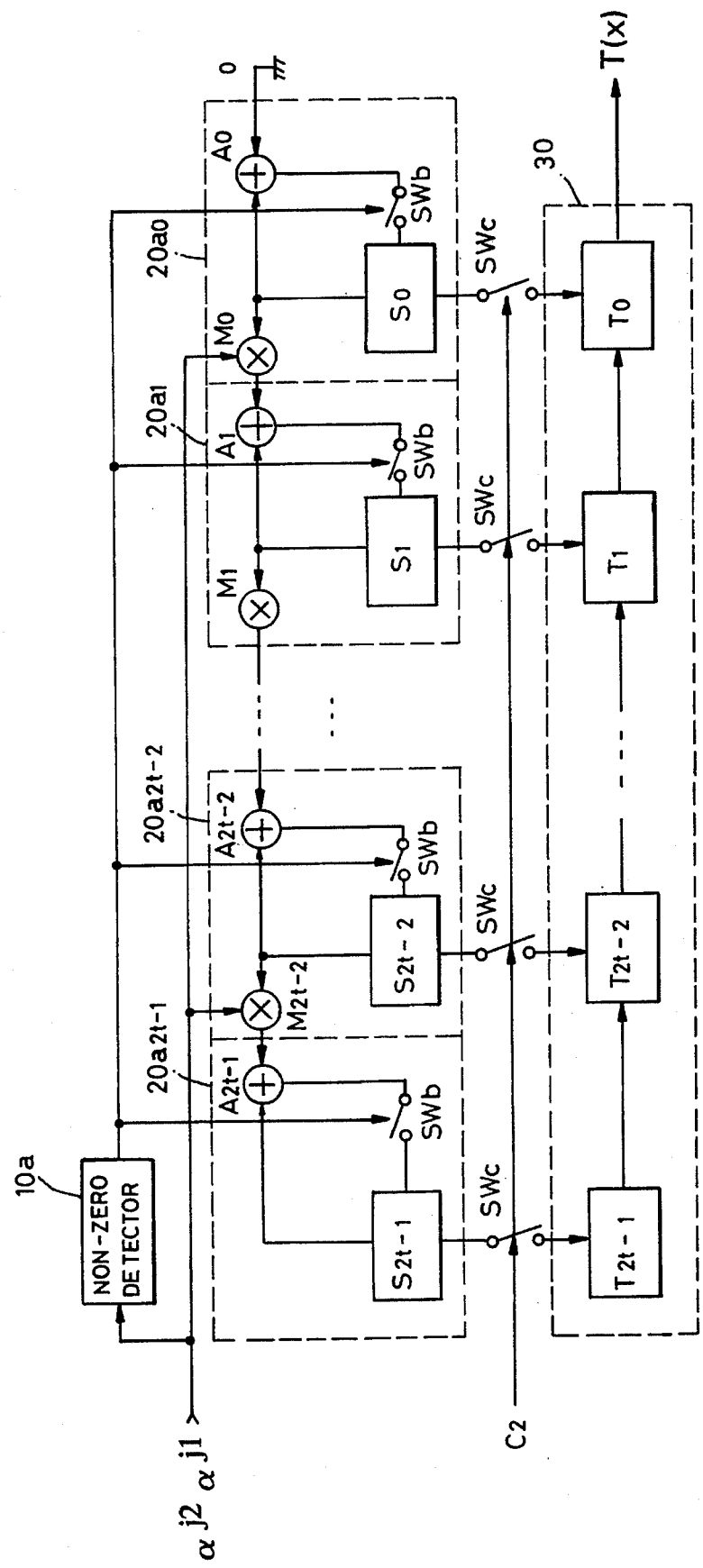
FIG. 5 is a block diagram of a conventional operation apparatus for deriving a Fourney syndrome.

Accordingly, coefficients of the polynomial are sequentially outputted while increasing the degree of polynomial one by one in the order of $\Gamma_1(X)$ of the first degree, $\Gamma_2(X)$ of the second degree, . . . , and $\Gamma_e(X)$ of the e-th degree. Outputted coefficients of the polynomial $\Gamma(X)$ are loaded in the storing register 51 of FIG. 5.

The first and second registers 53 and 54 are initialized to 1 and 0 for every clock, respectively. The multiplexor 52 is also initialized to 0.

As 0 is outputted from the multiplexor 52, the first and second registers 53 and 54 receives 0 which is the current coefficient of the polynomial ($\Gamma_i(X)=0$) and 1 which is the previous coefficient of the polynomial $\Gamma_{i-1}(X)=1$). Accordingly, 1 is inputted at the storing register 51.

Next, as $\alpha^{j1}$ corresponding to the first erasure position is inputted, $\alpha^{j1}$ is applied to the storing register 51 $\Gamma(X)=\alpha^{j1}$).

At this time, the first register 53 adapted to store the current input value therein is loaded with $\Gamma(X)=1$. On the other hand, the second register 54 adapted to store the previous input value therein is loaded with $\Gamma_0(X)=\alpha^{j1}$. Thus the operation for n=1 is completed.

Thereafter, an operation for n=2 is carried out.

That is, as $\alpha^{j2}$ corresponding to the second erasure position is inputted, the multiplexor 52 selects $\alpha^{j1}$. At this time, 1 is loaded in the storing register 51, since the first and second registers 53 and 54 have been set to 1 and 0, respectively.

Then, the first and second registers 53 and 54 are loaded with $\Gamma_i(X)=\alpha^{j1}$ and $\Gamma_{i-1}(X)=1$, respectively. The multiplier 55 then multiplies the value $\Gamma_{i-1}(X)=1$ loaded in the second register 54 and the value $\alpha^{j2}$ corresponding to the power value of the second erasure position received from the erasure position power value input and thus outputs the value $\alpha^{j2}$. The output value $\alpha^{j2}$ from the multiplier 55 is applied to the adder 56, so that it is added with the value $\alpha^{j1}$ loaded in the first register 53.

Accordingly, the storing register 51 receives the output value $\alpha^{j1}+\alpha^{j2}$ from the adder 56 and stores it therein.

At this time, the multiplexor 52 selects 0,

Since the values $\Gamma_i(X)$ and $\Gamma_{i-1}(X)$ of the first and second registers 53 and 54 are 0 and 1 ($\Gamma_i(X)=0$ and $\Gamma_{i-1}(X)=1$), respectively, the value $\alpha^{j1}\alpha^{j2}$ subsequently operated through the multiplier 55 and the adder 56 is applied to the storing register 51. Thus, the operation for n=2 is completed.

At this time, the content loaded in the storing register 51 includes $\Gamma_0(X)=\alpha^{j1}+\alpha^{j2}$, $\Gamma_2(X)=\alpha^{j1}\alpha^{j2}$, $\Gamma_2(X)=1$, $\Gamma_3(X)=\alpha^{j1}$ and $\Gamma_4(X)=1$.

As the operation is repeated up to n=e, in such a manner, coefficients of the erasure position polynomial are sequentially stored in the storing register 51.

Referring to FIG. 9, there is illustrated variations in values $\Gamma_i$ and $\Gamma_{i-1}$ stored in the first and second registers 53 and 54 and in value $\Gamma(X)$ loaded in the storing register 51.

Now, a procedure that the value corresponding to the input erasure position and the value loaded in the second register 54 are multiplied in the multiplier 55 will be described, in conjunction with FIGS. 7 and 8.

The AND gates $AD_{1.1}$, $AD_{1.3}$, $AD_{1.5}$ and $AD_{1.7}$ for AND-combining 4-bit input data $\tau_0$, $\tau_1$, $\tau_2$ and $\tau_3$ and 4-bit input data $\beta_0$, $\beta_1$, $\beta_2$ and $\beta_3$ output values $\tau_0 \cdot \beta_0$, $\tau_1 \cdot \beta_0$, $\tau_2 \cdot \beta_0$ and $\tau_3 \cdot \beta_0$, respectively. The AND gates $AD_{3.1}$, $AD_{3.3}$, $AD_{3.5}$ and $AD_{3.7}$ output values $\tau_0 \cdot \beta_1$, $\tau_1 \cdot \beta_1$, $\tau_2 \cdot \beta_1$ and $\tau_3 \cdot \beta_1$, respectively. The exclusive OR gate $XOR_{4.4}$ outputs a value $((\tau_0 \cdot \beta_1) + (\tau_1 \cdot \beta_1)X + (\tau_2 \cdot \beta_1)X^2 + (\tau_3 \cdot \beta_1)X^3)X$.

On the other hand, the AND gates $AD_{5.1}$, $AD_{5.3}$, $AD_{5.5}$ and $AD_{5.7}$ output values $\tau_0 \cdot \beta_2$, $\tau_1 \cdot \beta_2$, $\tau_{2 \cdot \beta 2}$ and $\tau_3 \cdot \beta_2$, respectively. The exclusive OR gates $XOR_{6.4}$ and $XOR_{6.6}$ output a value $((\tau_0 \cdot \beta_2) + (\tau_1 \cdot \beta_2)X + (\tau_2 \cdot \beta_2)X^2 + (\tau_3 \cdot \beta_2)X^3)X$. The AND gates $AD_{7.1}$, $AD_{7.3}$, $AD_{7.5}$ and $AD_{7.7}$ output values $\tau_0 \cdot \beta_3$, $\tau_1 \cdot \beta_3$, $\tau_2 \cdot \beta_3$ and $\tau_3 \cdot \beta_3$ respectively.

The values outputted from the AND gates $AD_{7.1}$, $AD_{7.3}$, $AD_{7.5}$ and $AD_{7.7}$ are applied to the exclusive OR gates $XOR_{8.4}$, $XOR_{8.6}$ and $XOR_{8.8}$ which, in turn, perform exclusive ORing operations and thus output a value $((\tau_0 \cdot \beta_3) + (\tau_1 \cdot \beta_3)X + (\tau_2 \cdot \beta_3)X^2 + (\tau_3 \cdot \beta_3)X^3)X^2$.

As mentioned above, the AND gates $AD_{1.1}$, $AD_{1.3}$, $AD_{1.5}$, $AD_{1.7}$, $AD_{3.1}$, $AD_{3.3}$, $AD_{3.5}$, $AD_{3.7}$, $AD_{5.1}$, $AD_{5.3}$, $AD_{5.5}$, $AD_{5.7}$, $AD_{7.1}$, $AD_{7.3}$, $AD_{7.5}$ and $AD_{7.7}$ are always fixed, irrespective of the source polynomial P(X). However, the exclusive OR gates $XOR_{6.4}$, $XOR_{6.6}$, $XOR_{8.4}$, $XOR_{8.6}$ and $XOR_{8.8}$ are determined by the source polynomial P(X).

Figure 8:
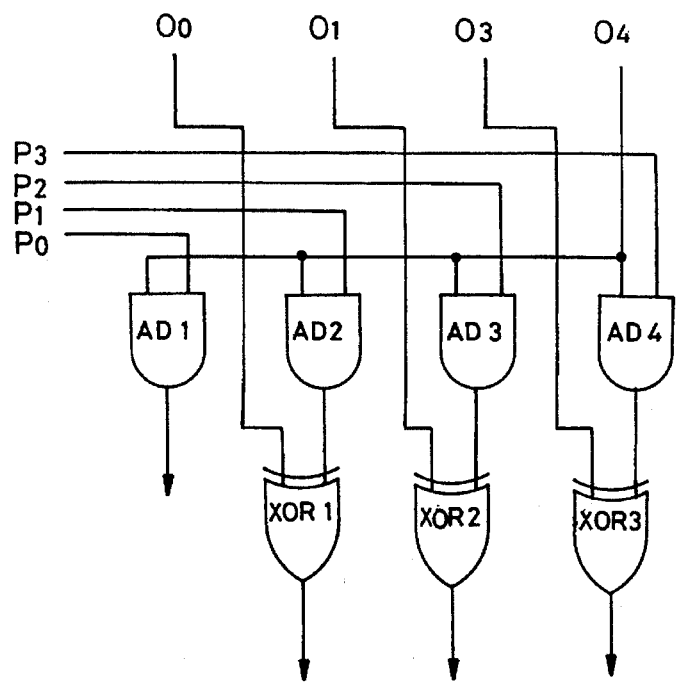
FIG. 8 is a circuit diagram of a circuit substituted for exclusive OR gates of FIG. 7.

In a calculation with respect to an optional source polynomial $P(X) = P_3X^3 + P_2X^2 + P_1X + P_0$, a circuit of FIG. 8 may be used.

The exclusive OR gate $XOR_{9.2}$ receives outputs from the AND gates $AD_{1.1}$, $AD_{3.7}$, $AD_{5.5}$ and $AD_{7.3}$ and exclusively ORs them, to output a final value $W_0$. The exclusive OR gate $XOR_{9.4}$ receives an output from the AND gate $AD_{1.3}$ and outputs from the exclusive OR gates $XOR_{4.4}$, $XOR_{6.4}$ and $XOR_{8.4}$ and exclusively ORs them, to output a final value $W_1$.

On the other hand, the exclusive OR gate $XOR_{9.6}$ receives outputs from the AND gates $AD_{1.5}$ and $AD_{3.3}$ and outputs from the exclusive OR gates $XOR_{6.6}$ and $XOR_{8.6}$ and exclusively ORs them, to output a final value $W_2$. The exclusive OR gate $XOR_{9.8}$ receives outputs from the AND gates $AD_{1.7}$, $AD_{3.5}$ and $AD_{5.3}$ and an output from the exclusive OR gate $XOR_{8.8}$ and exclusively ORs them, to output a final value $W_3$.

The calculation procedures are summarized by the following equation:

$$\begin{aligned} \tau \cdot \beta &= (\tau_0 + \tau_1 X + \tau_2 X^2 + \tau_3 X^3) \cdot \\ & \quad (\beta_0 + \beta_1 X + \beta_2 X^2 + \beta_3 X^3) \\ &= (\tau \cdot \beta_0) + (\tau \cdot \beta_1)X + (\tau \cdot \beta_2)X^2 + (\tau \cdot \beta_3)X^3 \\ &= W \end{aligned}$$

The value W is applied to the adder 56 of FIG. 6 and added with the value stored in the first register 53.

That is, when the value $(\tau \cdot \beta) + \Theta$ is required to be derived, which corresponds to a value obtained by adding the value $\Theta$ stored in the first register 53 to the value $\tau \cdot \beta$ inputted at the adder 56, input data $\Theta_0$, $\Theta_1$, $\Theta_2$ and $\Theta_3$ are applied to inputs of the exclusive OR gates $XOR_{9.2}$, $XOR_{9.4}$, $XOR_{9.6}$ and $XOR_{9.8}$, respectively.

For an operation in $GF(2^m)$ other than $GF(2^4)$, it can be achieved by an expansion design up to 2M+1 rows and 2M columns.

FIG. 10 is a block diagram of a Forney syndrome operation apparatus according to a second embodiment of the present invention.

As shown in FIG. 10, the operation apparatus comprises a storing register 61 for storing results sequentially inputted therein, a multiplexor 62 for receiving outputs from the storing register 61 and selecting a necessary coefficient, and a switch SW for selecting one of an output value of the multiplexor 62 and a syndrome S(X). To the multiplexor 62, a first register 63 and a second register 64 are connected via the switch SW. The registers 53 and 64 receive the coefficient currently selected by the multiplexor 52 and the coefficient just previously selected by the multiplexor 52, respectively. The operation apparatus also comprises a multiplier 65 for multiplying a power value $\alpha^{jk}$ corresponding to an input erasure position and the coefficient loaded in the second register 64, and an adder 66 for adding a value outputted from the multiplier 65 to the coefficient loaded in the first register 63 and outputting the resultant value to the storing register 61.

The Forney syndrome is expressed by the following equation:

$$T(X) = S(X) \cdot \prod_{i=1}^{e} (1 - \alpha^{j(i)} \cdot x)$$

wherein, e represents the number of erasures.

Accordingly, the syndrome S(X), can be calculated in the order of $T_1(X) \to T_2(X) \ldots \to T_e(X)$, in similar manner to the erasure position polynomial.

In this case, the i-th coefficient of $T_n(X)$ is expressed as follows:

$$T(i) = T_n(i) - T_{n-1}(i-1)\alpha^{j(n)}$$

$$T_n(0) = S_0$$

The above procedure will be described in detail.

Initially, the switch SW is connected at its movable terminal c to its fixed terminal a so that $S_0$ to $S_{2t-1}$ of the syndrome S(X) are sequentially inputted.

When a calculation through the first and second registers and 64, the multiplier 65 and tile adder 66 is completed, the storing register 61 is loaded with $S_{2t-1}\alpha^{j1}$, $S_{2t-1}\alpha^{j1} + S_{2t-1}$, ..., $S_1\alpha^{j1} + S_0$ and $S_0\alpha^{j1} + S_0$, in this order.

Thereafter, the switch SW is switched such that the movable terminal c is connected to the fixed terminal b. At this time, the first and second registers 63 and 64 are set to 0. Then, the multiplexor 62 selects $S_0\alpha^{j1} + S_1$. Accordingly, the values $T_i$ and $T_{i-1}$ stored in the first and second registers 63 and 64 become $S_0\alpha^{j1} + S_1$ and $S_0$, respectively, so that the storing register 61 receives $S_0\alpha^{j2} + S_0\alpha^{j1} + S_1$ as its input The multiplexor 62 selects $S_1\alpha^{j1} + S_2$.

After the operation is carried out up to $S_{2t-1}\alpha^{j2}$, the calculation for n=2 is completed.

That is, the calculation is repeated 2t+1 times, for calculating $T_2(X)$. For n=3, calculations of 2t+1 times are repeatedly carried out, so as to complete the calculation for $T_3(X)$.

After the polynomial T(X) with the degree of 2t-1+e is calculated by repeating the above procedures, it is applied to the storing register 61.

The switch SW may be omitted. In this case, the syndrome S(X) is directly inputted at the storing register 6.

The storing registers 51 and 61 are capable of storing the maximum length, namely, 2t+e coefficients. Preferably, they are last-in first-out registers.

As apparent from the above description, the present invention makes it possible to derive an erasure position polynomial by using a single multiplier and a single adder, irrespective of an error correction capacity, upon sequentially deriving coefficients of the erasure position polynomial while increasing the degree of the erasure position polynomial one by one. Accordingly, an integration of the operation apparatus can be possible. Also, the present invention provides effects of simplifying the design of the adder and achieving a correct operation.

Although the preferred embodiments of the invention have been disclosed for illustrative purposes, those skilled in the art will appreciate that various modifications, additions and substitutions are possible, without departing from the scope and spirit of the invention as recited in the accompanying claims.

What is claimed is:

1. An operation apparatus for deriving an erasure position polynomial of a Galois field, comprising:

a storing register means for storing result values sequentially inputted therein;

a multiplexor means for receiving outputs from the storing register means and selecting a necessary coefficient therefrom;

a first register means and a second register means for storing a coefficient currently selected by the multiplexor means and a coefficient previously selected by the multiplexor means, respectively;

a single multiplier means for multiplying a value, corresponding to an input erasure position and the coefficient loaded in the second register means; and a single adder means for adding a value outputted from the multiplier means to the coefficient stored in the first register means and inputting the resultant value to the storing register means.

2. An operation apparatus for deriving an erasure position polynomial of a Galois field, comprising:

a storing register for storing result values sequentially inputted therein;

a multiplexor for receiving outputs from the storing register and selecting a necessary coefficient therefrom;

a first register and a second register for storing a coefficient currently selected by the multiplexor and a coefficient previously selected by the multiplexor, respectively;

a multiplier for multiplying a value corresponding to an input erasure position and the coefficient stored in the second register; and an adder for adding a value outputted from the multiplier to the coefficient stored in the first register and inputting the resultant value to the storing register: wherein the adder logically operates multiplication outputs ($W_0$, $W_1$, $W_2$ and $W_3$) for a 4-bit input data ($\tau_0$, $\tau_1$, $\tau_2$ and $\tau_3$) and 4-bit input data ($\beta_0$, $\beta_1$, $\beta_2$ and $\beta_3$), in the following order:

$W_0=(\tau_0 \cdot \beta_0)+(\tau_1 \cdot \beta_3)+(\tau_3 \cdot \beta_1)+(\tau_2 \cdot \beta_2)$ $W_1=(\tau_1 \cdot \beta_0)+(\tau_3 \cdot \beta_1)+(\tau_0 \cdot \beta_1)+((\tau_3 \cdot \beta_2)+(\tau_2 \cdot \beta_2))+(\tau_1 \cdot \beta_3)$ $W_2=(\tau_2 \cdot \beta_0)+(\tau_1 \cdot \beta_1)+((\tau_3 \cdot \beta_2)+(\tau_0 \cdot \beta_2))+((\tau_2 \cdot \beta_3)+(\tau_3 \cdot \beta_3))$ $W_3=(\tau_3 \cdot \beta_0)+(\tau_2 \cdot \beta_1)+(\tau_1 \cdot \beta_2)+((\tau_0 \cdot \beta_3)+(\tau_3 \cdot \beta_3))$.

3. An operation apparatus for deriving an erasure position polynomial of a Galois field, comprising:

a storing register for storing result values sequentially inputted therein;

a multiplexor for receiving outputs from the storing register and selecting a necessary coefficient therefrom;

a first register and a second register for storing a coefficient currently selected by the multiplexor and a coefficient previously selected by the multiplexor, respectively;

a multiplier for multiplying a value corresponding to an input erasure position and the coefficient stored in the second register; where in the multiplier comprises:

a plurality of AND gates ($AD_{1.1}$, $AD_{1.3}$, $AD_{1.5}$, $AD_{1.7}$, $AD_{3.1}$, $AD_{3.3}$, $AD_{3.5}$, $AD_{3.7}$, $AD_{5.1}$, $AD_{5.3}$, $AD_{5.5}$, $AD_{5.7}$, $AD_{7.1}$, $AD_{7.3}$, $AD_{7.5}$ and $AD_{7.7}$) each for AND-combining a selected one of 4-bit input data ($\tau_0$, $\tau_1$, $\tau_2$ and $\tau_3$) and a selected one of 4-bit input data ($\beta_0$, $\beta_1$, $\beta_2$ $\beta_3$);

a plurality of exclusive OR gates ($XOR_{4.4}$, $XOR_{6.4}$, $XOR_{6.6}$, $XOR_{8.4}$, $XOR_{8.6}$ and $XOR_{8.8}$) for exclusively ORing outputs from the AND gates ($AD_{3.1}$ and $AD_{3.7}$), outputs from the AND gates ($AD_{5.5}$ and $AD_{5.7}$), outputs from the AND gates ($AD_{5.1}$ and $AD_{5.7}$), output from the AND gates ($AD_{7.1}$ and $AD_{7.3}$), and outputs from the AND gates ($AD_{7.5}$ and $AD_{7.7}$), and outputs from the AND gates ($AD_{7.2}$ and $AD_{7.7}$), respectively;

an exclusive OR gate ($XOR_{9.2}$) for exclusively ORing outputs from the AND gates ($AD_{1.1}$, $AD_{3.7}$, $AD_{5.5}$ and $AD_{7.3}$) and outputting a resultant value ($W_0$);

an exclusive OR gate ($XOR_{9.4}$) for exclusively ORing an output from the AND gate ($AD_{1.3}$) and outputs from the exclusive OR gates ($XOR_{4.4}$, $XOR_{6.4}$ and $XOR_{8.4}$) and outputting a resultant value ($W_1$);

an exclusive OR gate ($XOR_{9.6}$) for exclusively ORing outputs from the AND gates ($AD_{1.5}$ and $AD_{3.3}$) and outputs from the exclusive OR gates ($XOR_{6.6}$ AND $XOR_{8.6}$) and outputting a resultant value ($W_2$); and an exclusive OR gate ($XOR_{9.8}$) for exclusively ORing outputs from the AND gates ($AD_{1.7}$, $AD_{3.5}$ and $AD_{5.3}$) and an output from the exclusive OR gate ($XOR_{8.8}$) and outputting a resultant value ($W_3$), and an adder for adding a value outputted from the multiplier to the coefficient stored in the first register and inputting the resultant value to the storing register.

4. An operation apparatus in accordance with claim 1, further comprising a switch mean for selecting the value outputted from the multiplexor means and a syndrome value and sending them to the first register.

5. An operation apparatus in accordance with claim 1, wherein the storing register means is a last-in first-out register.

6. An operation apparatus in accordance with claim 1, wherein the storing register means receives a syndrome value directly.

* * * * *